(12) United States Patent
Nguyen et al.

(10) Patent No.: US 7,221,553 B2
(45) Date of Patent: May 22, 2007

(54) SUBSTRATE SUPPORT HAVING HEAT TRANSFER SYSTEM

(75) Inventors: Andrew Nguyen, San Jose, CA (US); Wing Lau Cheng, Sunnyvale, CA (US); Hiroji Hanawa, Sunnyvale, CA (US); Semyon L. Kats, San Francisco, CA (US); Kartik Ramaswamy, Santa Clara, CA (US); Yan Ye, Saratoga, CA (US); Kwok Manus Wong, San Jose, CA (US); Daniel J. Hoffman, Saratoga, CA (US); Tetsuya Ishikawa, Saratoga, CA (US); Brian C. Lue, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 362 days.

(21) Appl. No.: 10/421,473

(22) Filed: Apr. 22, 2003

(65) Prior Publication Data

US 2004/0212947 A1    Oct. 28, 2004

(51) Int. Cl.
*H05F 3/00* (2006.01)
(52) U.S. Cl. .................... 361/234; 361/233
(58) Field of Classification Search ........... 361/230, 361/231, 232, 233, 234, 235; 165/80.1
See application file for complete search history.

(56) References Cited

U.S. PATENT DOCUMENTS

| | | | |
|---|---|---|---|
| 4,628,991 A * | 12/1986 | Hsiao et al. ............... | 165/80.4 |
| 5,155,652 A | 10/1992 | Logan et al. | |
| 5,423,945 A | 6/1995 | Marks et al. | |
| 5,754,391 A | 5/1998 | Bates | |
| 5,761,023 A | 6/1998 | Lue et al. | |
| 5,883,778 A | 3/1999 | Sherstinsky et al. | |
| 5,892,207 A | 4/1999 | Kawamura et al. | |
| 6,015,761 A | 1/2000 | Merry et al. | |
| 6,079,356 A * | 6/2000 | Umotoy et al. .......... | 118/723 E |
| 6,107,608 A * | 8/2000 | Hayes ..................... | 219/444.1 |
| 6,310,755 B1 | 10/2001 | Kholodenko et al. | |
| 6,320,736 B1 * | 11/2001 | Shamouilian et al. ....... | 361/234 |
| 6,357,143 B2 | 3/2002 | Morad et al. | |
| 6,440,221 B2 | 8/2002 | Shamouilian et al. | |
| 6,466,426 B1 | 10/2002 | Mok et al. | |
| 6,489,248 B2 | 12/2002 | Zhang et al. | |
| 6,499,533 B2 | 12/2002 | Yamada | |
| 6,518,548 B2 * | 2/2003 | Sugaya et al. ........... | 219/444.1 |

(Continued)

OTHER PUBLICATIONS

Leyda, Bryan D., "Duocel Aluminum Foam", product information from ERG Materials and Aerospace Corporation, Oakland, CA, publication date unknown.

*Primary Examiner*—Brian Sircus
*Assistant Examiner*—Danny Nguyen
(74) *Attorney, Agent, or Firm*—Janah & Associates

(57) ABSTRACT

A support for a substrate processing chamber has upper and lower walls that are joined by a peripheral sidewall to define a reservoir. A fluid inlet supplies a heat transfer fluid to the reservoir. In one version, a plurality of protrusions extends into the reservoir to perturb the flow of the heat transfer fluid through the reservoir. In another version, the reservoir is an elongated channel having one or more of (i) serpentine convolutions, (ii) integral fins extending into the channel, (iii) a roughened internal surface, or (iv) a changing cross-section. A fluid outlet discharges the heat transfer fluid from the reservoir.

23 Claims, 7 Drawing Sheets

U.S. PATENT DOCUMENTS

| | | | |
|---|---|---|---|
| 6,786,982 B2 * | 9/2004 | Lee et al. | 148/400 |
| 6,853,067 B1 * | 2/2005 | Cohn et al. | 257/704 |
| 6,902,934 B1 * | 6/2005 | Bergh et al. | 436/37 |
| 2003/0159307 A1 * | 8/2003 | Sago et al. | 34/107 |
| 2003/0228772 A1 * | 12/2003 | Cowans et al. | 438/795 |
| 2004/0115947 A1 * | 6/2004 | Fink et al. | 438/716 |

* cited by examiner

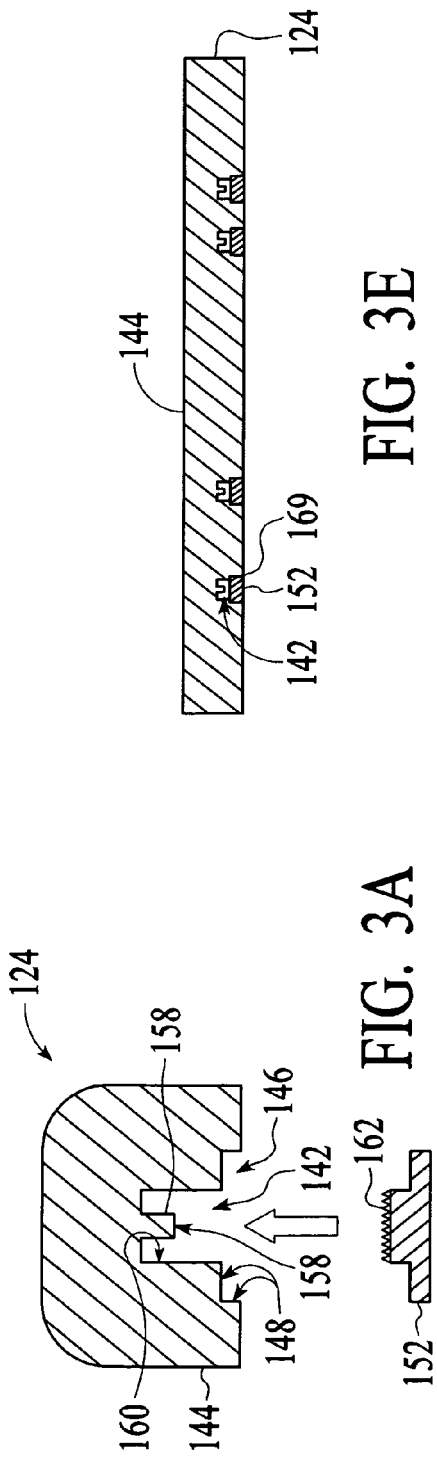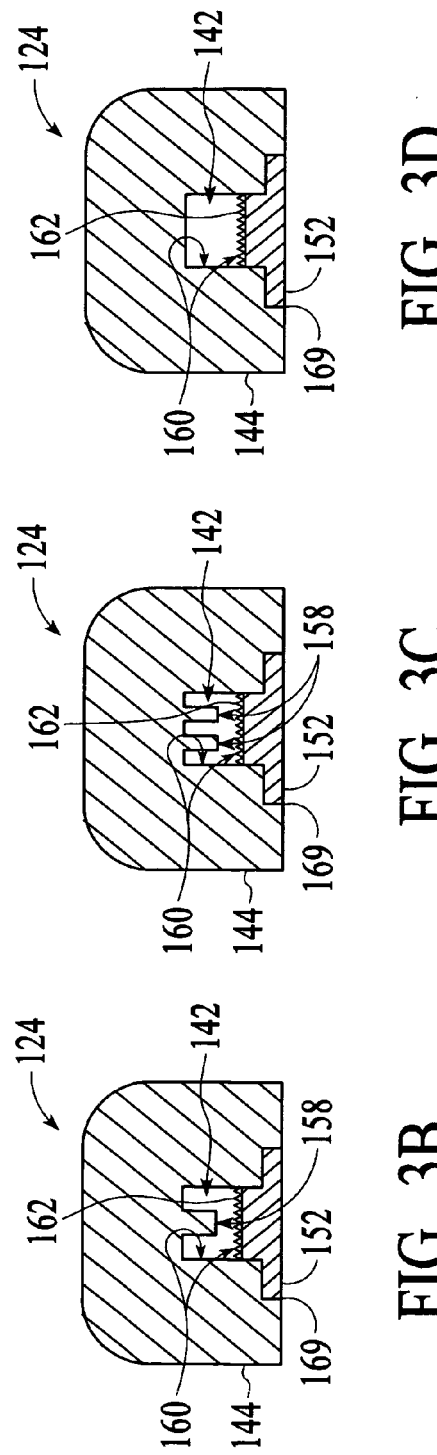

SUBSTRATE SUPPORT HAVING HEAT TRANSFER SYSTEM

BACKGROUND

Embodiments of the present invention relate to a support for holding a substrate during processing.

A substrate support is used to hold a substrate, such as a silicon wafer or display, in a process chamber. The support can comprise a pedestal that receives a chuck that is capable of holding the substrate. The chuck may be a mechanical, vacuum, or electrostatic chuck. The electrostatic chuck electrostatically holds the substrate by electrostatically charging a monopolar or bipolar electrode covered by, or embedded in, a dielectric material, such as ceramic or polymer. The pedestal allows the electrical connections to the chuck to pass through and may also have fluid circulating conduits and channels to circulate a heat transfer fluid to heat or cool the substrate being held on the chuck during processing.

Newly developed plasma processes for the fabrication of integrated circuits are often performed at low, often subzero, temperatures or at high temperatures, which may exceed 100° C. For example, certain etching processes, such as processes used to etch low K dielectric materials, may be performed at temperatures below zero, for example, at −20 to −40° C. Conversely, processes for etching copper or platinum, or sputtering (PVD) processes, are often conducted at high temperatures of from 250 to 600° C., and temperatures used to etch aluminum may range from 100 to 200° C. It is difficult to maintain uniform temperatures across the surface of a substrate during such processes, especially when the plasma contributes to the heat load. For example, a gas plasma that is sustained by applying a power level of 2000 Watts to an inductor antenna or electrode can generate temperature variations of at least about 10° C. across a 300 mm diameter wafer. These temperature variations can have different magnitudes across the surface of the substrate.

In one method of maintaining more uniform temperatures across the substrate, heat transfer channels are distributed in the pedestal or chuck, and a cooled or heated fluid is circulated in the channels to stabilize substrate temperatures. The channels originate at a fluid inlet that receives the cooled or heated fluid, traverse the area of the support in a circuitous pathway, and terminate at a fluid outlet. However, the temperature of the support at the fluid inlet can often be hotter or colder than the temperature of the support at the fluid outlet, depending on whether the fluid receives or dissipates heat in traveling from the inlet to the outlet. In another configuration, the fluid channel loops back upon itself to form two closely abutting pathways that traverse across the area of the support. While the looped back channel reduces the inlet to outlet temperature variation, a hot or cold spot often still forms at the region of the support where the channel loops back upon itself.

Thus, it is desirable to have an apparatus capable of supporting and maintaining a substrate at uniform temperatures, especially when the substrate is processed at sub-zero or hot temperatures. Is also desirable to control the temperature of the substrate in processes that generate different heat loads, especially plasma processes.

SUMMARY

In one aspect, the invention relates to a substrate support for a substrate processing chamber has a chuck with a substrate receiving surface. A fluid circulating reservoir is below the chuck, the reservoir comprising upper and lower walls joined by a peripheral sidewall. A fluid inlet supplies a heat transfer fluid to the reservoir. A plurality of protrusions extend into the reservoir to perturb the flow of heat transfer fluid in the reservoir. A fluid outlet discharges the heat transfer fluid from the reservoir.

Another version of the substrate support has an upper wall having a channel therein and comprising integral fins that are spaced apart and extend outwardly from the upper wall and into the channel. A lower wall covers the channel. A fluid inlet passes a heat transfer fluid into the channel, and a fluid outlet discharges the heat transfer fluid.

Yet another version of the substrate support has upper and lower walls that are joined together to form a channel therebetween. The channel has a roughened internal surface with a root mean square roughness value of at least about 125 microns. Alternatively, the channel has a first cross-section along a first length of the channel and a second cross-section along a second length of the channel. A fluid inlet passes a heat transfer fluid into the channel, and a fluid outlet discharges the heat transfer fluid.

In another aspect, the present invention relates to a substrate processing method includes placing a substrate having an area, in a process zone. A temperature of the substrate is regulated by (i) flowing a heat transfer fluid through an enclosed volume below the substrate area such that the fluid does not contact the substrate, and (ii) perturbing the flow of the heat transfer fluid in the enclosed volume by forcing the heat transfer fluid to flow around protrusions in the enclosed volume. A process gas is introduced into the process zone and energized to process the substrate. After processing, the process gas is exhausted from the process zone.

DRAWINGS

FIG. 3a is an exploded cross-sectional side view of a portion of an assembly of shaped walls used to form the substrate support of FIG. 1;

FIG. 3b is an exploded cross-sectional side view of the portion of the substrate support of FIG. 3a after assembly;

FIG. 3c is an exploded cross-sectional side view of a portion of an embodiment of a substrate support having a channel with two integral fins extending therein;

FIG. 3d is an exploded cross-sectional side view of a portion of an embodiment of a substrate support having a channel with no integral fins extending therein;

FIG. 3e is a cross-sectional side view of an embodiment of a substrate support having the channel of FIG. 3b passing therethrough;

FIG. 4b is a cross-sectional side view of the substrate support of FIG. 4a;

DESCRIPTION

Figure 1:
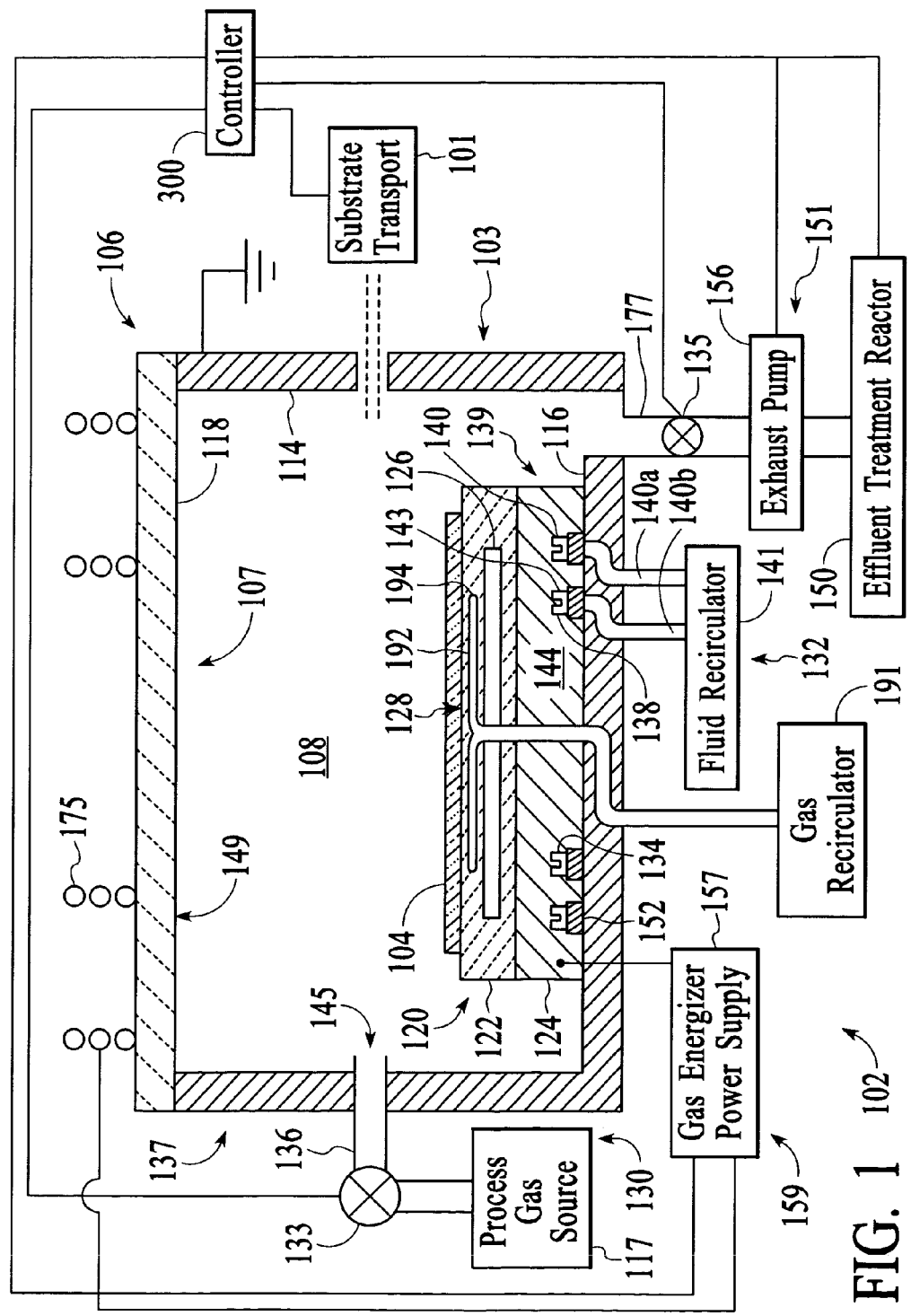
FIG. 1 is a schematic side view of an embodiment of a substrate processing apparatus and process chamber.

A substrate processing apparatus 102 comprises a process chamber 106 having a process zone 108 for processing of the substrate 104. The process chamber 106 may be a chamber 106 adapted to etch or deposit material on the substrate 104. For example, the process chamber 106 may be an etching chamber type such as a DPS®, Etch Centura®, MERIE HART Centura®, MXP®, Super e Centura®, IPS Centurs® (all trademarks of Applied Materials, Santa Clara, Calif., and all of which are fabricated by the same), eMax chamber, or a chemical vapor deposition (CVD) or physical vapor deposition (PVD) chamber. An exemplary embodiment of an apparatus 102 suitable for processing a substrate 104 is shown in FIG. 1. The process chamber 106 is suitable for processing substrates 104, such as semiconductor wafers, and may be adapted by those or ordinary skill to process other substrates 104, such as flat panel displays, polymer panels, or other electrical circuit receiving structures. The chamber 106 is particularly useful for processing layers, such as etch resistant, silicon-containing, metal-containing, dielectric, and/or conductor layers on the substrate 104. Generally, the process chamber 106 comprises a wall 107, such as an enclosure wall 103, which may comprise a ceiling 118, sidewalls 114, and a bottom wall 116, that encloses the process zone 108. The chamber 106 may be fabricated from any of a variety or materials including metals, semiconductors. ceramics, glasses, polymers and composite materials. Metals commonly used to fabricate the chamber 106 include aluminum, anodized aluminum, "HAYNES 242," "AI-6061," "35 304," "SS 316," and INCONEL, of which anodized aluminum is used to fabricated a preferred version. The ceiling 118 comprises a flat, rectangular, arcuate, conical, dome, or multiradius-arcuate shape. The particular embodiment of the apparatus 102 shown herein is suitable for processing of active and passive electronic devices on a substrate 104, and is provided only to illustrate the invention, and should not be used to limit the scope of the invention.

The process chamber 106 further comprises a substrate support 120 to support the substrate 104 in the chamber 106. The substrate support 120 comprises a chuck 122 having a substrate receiving surface 128. The chuck 122 may be a vacuum, mechanical or electrostatic chuck. A vacuum chuck has vacuum ports from which to apply a negative gas pressure to hold the substrate 104. A mechanical chuck comprises clamps (not shown) at the edge of the chuck to hold the substrate 104. A suitable electrostatic chuck 122a comprises a dielectric 125 having an embedded electrode 126 that may be charged to generate an electrostatic force capable of electrostatically holding a substrate 104 to the receiving surface 126 of the chuck 122. For example, the dielectric 125 of the electrostatic chuck 122a may comprise AIN. A voltage may be applied to the electrode 126 via an electrical contact that extends through the dielectric 125- The electrode 126 may comprise a semiconductor or metal material. The base 124 typically comprises a metal, such as for example aluminum.

The substrate support 120 comprises a heat transfer system 132 to maintain the substrate support 120 at a desired temperature. For example, the heat transfer system 132 is adapted to maintain the substrate receiving surface 125 of the support 120 at a desired temperature to regulate the temperature of the substrate 104 sitting thereon. The heat transfer system 132 allows control of the temperature of the substrate 104 by compensating for variations in the calorific heat or heat conductance across the body of the support 120, which are a particular problem for supports 120 made from different materials or having complex internal configurations. Also, different processes may generate different plasma heat loads. In one embodiment, the heat transfer system 32 is adapted to maintain the substrate 104 at a temperature of from about −10 to about −30° C., such as about −20° C.

The heat transfer system 132 of tho substrate support 120 comprises a fluid circulating reservoir 134 below the chuck 122, a fluid inlet 143 for supplying a fluid 138 into the reservoir 134, and a fluid outlet 140 for discharging the fluid 138 from the reservoir 134. The fluid 138 is preferably a liquid because it can have a higher specific hoot and allow more turbulence than a gas. More preferably, the fluid 138 is a heat transfer fluid having high thermal conductivity and/or higher specific heat. The heat transfer fluid 138 is a liquid or gas medium that is suitable for exchanging heat, or thermal energy.

A fluid recirculator 141 may be provided to pass the fluid 138 through the reservoir 134 at a preselected temperature. For example, the fluid recirculator 141 may comprise a pump (not shown) to pump the fluid 138 through the reservoir 134, a cooler or heater (also not shown) to cool or heat the heat transfer fluid 138, and a thermostat (also not shown) to monitor the temperature of the heat transfer fluid 138 and control the cooler or heater to maintain the temperature at a desired level. In operation, the heat transfer fluid 138 is supplied to the fluid inlet 143 of the fluid conduit reservoir 134. The fluid 138 pumped into the fluid inlet 143, flows through the reservoir 134 to heat or cool the body of the chuck 122 (depending on the relative temperatures of the fluid 138 and the chuck 122), and is removed or exhausted from the fluid outlet 140. The reservoir 134 may be in the base 124 below the chuck 122 to provide more control over the temperature of the chuck 122, particularly when the chuck 122 is made of a ceramic material, such as aluminum nitride, aluminum oxide, or silicon oxide.

Figure 2B:
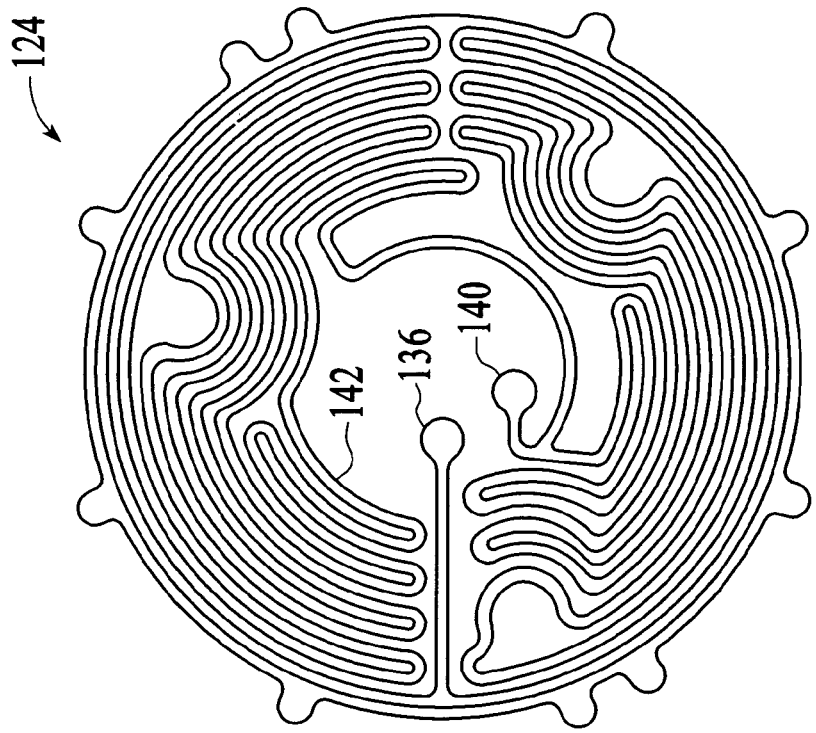
FIGS. 2a to 2b are schematic top views of embodiments of a substrate support having serpentine fluid channels.
Figure 2A:
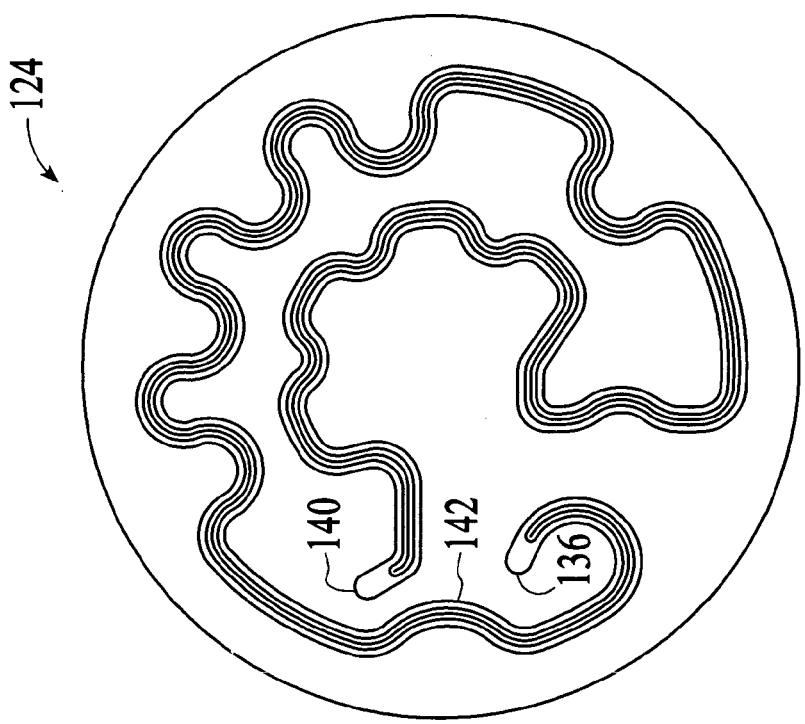

In one version, the heat transfer system 132 comprises a reservoir 134 that is an elongated fluid channel 142, embodiments of which are illustrated in FIGS. 2a and 2b. As illustrated in FIG. 3a, the heat transfer system 132 comprises an upper wall 144 having a recessed trench 146 with an attachment face 148 at a first depth. The fluid channel 142 is further sunken into the recessed trench 146 at a second depth, such that the fluid channel 142 at the second depth has a smaller width than the recessed trench 146 at the first depth. The fluid channel 142 may have an aspect ratio of depth to width of from about 2:1 to about 4:1 to provide a desirable fluid flux and Inner surface area. A lower wall 152 is seated into the recessed trench 146 of the upper wall 144, and attached at the attachment face 148, to close the fluid channel 142, forming a fluid-tight enclosure about the fluid channel 142. A cross-sectional view of the assembled base 124 about the fluid channel 142 Is Illustrated in FIG. 3b, and a cross-sectional view of the entire assembled base 124 is illustrated in FIG. 3e. The large, substantially continuously uninterrupted volume of the reservoir 134 across the support 120 provides better and more uniform heat transfer rates across the substrate 104. This improves the ability of tile support 120 to tolerate rapid or more severe changes in substrate temperature due to different heat loads from other process variations.

The upper wall 144 can be manufactured using machine tools and computer aided automation equipment to form the recessed trench 146 and the fluid channel 142. The upper wall 144 may be electron beam brazed or welded to the lower wall 152 at the attachment face 148. For example, the upper and lower walls 144, 152 may be bonded at a bonding region 169 along the radial periphery 154 of the attachment face 148, as shown in FIG. 3b.

In one version, the elongated fluid channel 142 comprises serpentine convolutions such that the fluid channel 142 curves back and forth along its length, embodiments of which are illustrated in FIGS. 2a and 2b. Generally, a boundary layer of fluid 138 adjacent to the Inner surfaces 160 of the channel 142 is substantially static relative to the movement of the non-boundary fluid layers farther away from the channel inner surfaces 160. When the boundary layer molecules absorb the heat and raise In temperature, they can no longer absorb further heat. As a result, the transference of heat from the inner surfaces 160 into the fluid 138 Is limited and constrained. In contrast, the flow of the channel 142 has a serpentine pattern that repetitively cascades along tile length of the fluid channel 142 to introduce perturbations into the heat transfer fluid 138, resulting in the breakage of temperature boundary layers of the fluid 138 flowing through the channel 142. The serpentine pattern perturbs laminar flow of the heat transfer fluid 138 through the channel 142 to expose high temperature contour lines within the fluid 138 to the inner surfaces 160 of the upper and lower walls 144, 152 and thereby Increase heat conduction to or from the upper and lower walls 144, 152. The contour lines are imaginary lines perpendicular to the gradient vector field corresponding to the temperature scalar field. As the heat transfer fluid 138 flows through the serpentine fluid channel 142, the contour lines are perturbed to become less parallel to the inner surfaces 160 of the upper and lower walls 144, 152. The serpentine fluid channel 442 Is shaped to have a sufficient density of back-and-forth turns along its length to substantially perturb the heat transfer fluid 138. In one embodiment, the upper and lower walls 144, 152 are adapted to form the serpentine fluid channel 142 to have at least about I back-and-forth turn per 5 centimeters The back-and-forth turns are typically fanned as a counter-flow to have more effective heat transfer characteristics.

In one embodiment, the upper wall 144 comprises one or more integral fins 158 extending outwardly into the elongated fluid channel 142 to enhance heat transfer, as illustrated in FIGS. 3b and 3c. The integral fins 158 form a unitary member with the upper wall 44 and extend outwardly from the upper wall 144 a length sufficiently long to form a gap between the tips of the fins 158 and the lower wall 162. For example, the upper wall 144 may comprise one to three fins 158. An exemplary embodiment wherein the upper wall 144 comprises one fin 158 is illustrated in FIG. 3b, an embodiment wherein the upper wall 144 comprises two fins 158 is illustrated in FIG. 3c, and an embodiment wherein the upper wall 144 does not comprise any fins 158 is illustrated in FIG. 3d. The integral fins 158 may have an aspect ratio of height to thickness or at least about 10:1 to enhance heat transfer between the heat transfer fluid 138 and the substrate support 120. Typically, the integral fins 158 are a unitary member with the upper wall 144, formed from the same material and substantially without any bonding lines therebetween, to provide good structural integrity and unimpeded heat conduction.

The elongated fluid channel 142 may have a first cross-section along a first length of the channel 142 and a second cross-section along a second length of the channel 142. For example, the channel 142 may have an alternating cross-section that changes back and forth along its length. The alternating cross-section creates turbulence in the heat transfer fluid 138 and thereby enhances heat transfer between the fluid 138 and the chuck 122. As the heat transfer fluid 138 passes through the channel 142, the laminar flow of the fluid 138 is perturbed to prevent the stagnation of fluid laminar near the inner surface of the channel 142. One example is a channel 142 where the cross-section alternates between one or more of (a) one integral fins 158 (as shown in FIG. 3b) (b) two integral fins 158 (FIG. 3c), and (c) no integral fins 158 (FIG. 3d), extending into the channel 142. The change In cross-section may occur abruptly or gradually along the length of the channel 142. The change in crass-section causes perturbation and turbulence in the flow of the heat transfer fluid 138 to redistribute the temperature field of the heat transfer fluid 135, thereby enhancing heat transfer between the fluid 135 and the substrate support 120.

In another embodiment, the elongated fluid channel 142 comprises a roughened internal surface 160 having a root mean square (rms) surface roughness value of at least about 125 microns, as shown in FIGS. 3a through 3d. For example, the rms surface roughness value of the internal surface 160 may be from about 125 to about 1000 microns such that the internal surface 160 is not so rough that it excessively impedes the flow of the heat transfer fluid 138. The surface roughness value is the square root of the mean of the squared values of the vertical deviation of the real surface from an ideal form. The roughened internal surfaces 160 of the upper and lower wells 144, 162 create turbulence in the heat transfer fluid 138 to enhance the transfer of heat to or from the fluid 138. As the heat transfer fluid 138 flows across the roughened Internal surface 180, the flow of the fluid 136 is disrupted to cause particles in the fluid to be deflected in random directions while still maintaining an overall flow direction continuing along the length of the fluid channel 142. The disruption of the fluid particles rearranges the spatial temperature distribution of the fluid particles in the channel 142, causing some higher temperature particles to move closer to the inner surfaces 160 of the channel 142. Outer laminar of the heat transfer fluid 138 are in close proximity to the inner surfaces 160 of the elongated fluid channel 142 and therefore approach the temperature of the support 120. .These outer laminar come upon the obstructive protrusions 162 and are redirected inwardly to redistribute the temperatures in the heat transfer fluid 138. This spatial temperature re-distribution enhances heat conduction between the heat transfer fluid 138 and the support 120.

In one embodiment, the elongated fluid channel 142 is doubled over upon itself to reduce the temperature gradient along the channel 142, as shown in FIG. 2a. For example, substantially the entire length of the elongated fluid channel 142 may be near another portion of the channel 142 to balance the temperature throughout the channel 142. Doubling over the channel 142 equalizes the temperature along the length of the channel 142 by placing portions of the channel 142 that correspond in hot/cold temperatures as neighbors such that the temperatures at these portions sum and substantially equalize.

For example, for a heat transfer fluid 138 that is hot, the temperature of the fluid 138 In the channel 142 is highest where the fluid 138 enters through the fluid inlet 143. The temperature of the fluid 138 generally decreases continuously as the fluid 138 passes through the length of the channel 142 , and is lowest as it exits through the outlet 140. By arranging the channel 142 such that the inlet 138 and outlet 140 portions are near each other, for example as shown in FIGS. 2a and 2b, the two portions next to the inlet 136 and outlet 140 moving toward the center of the channel 142, respectively, are near each other, and so on, the temperatures at these corresponding portions are matched to substantially flatten what would otherwise be a temperature gradient along the length of the channel 142.

Figure 4A:
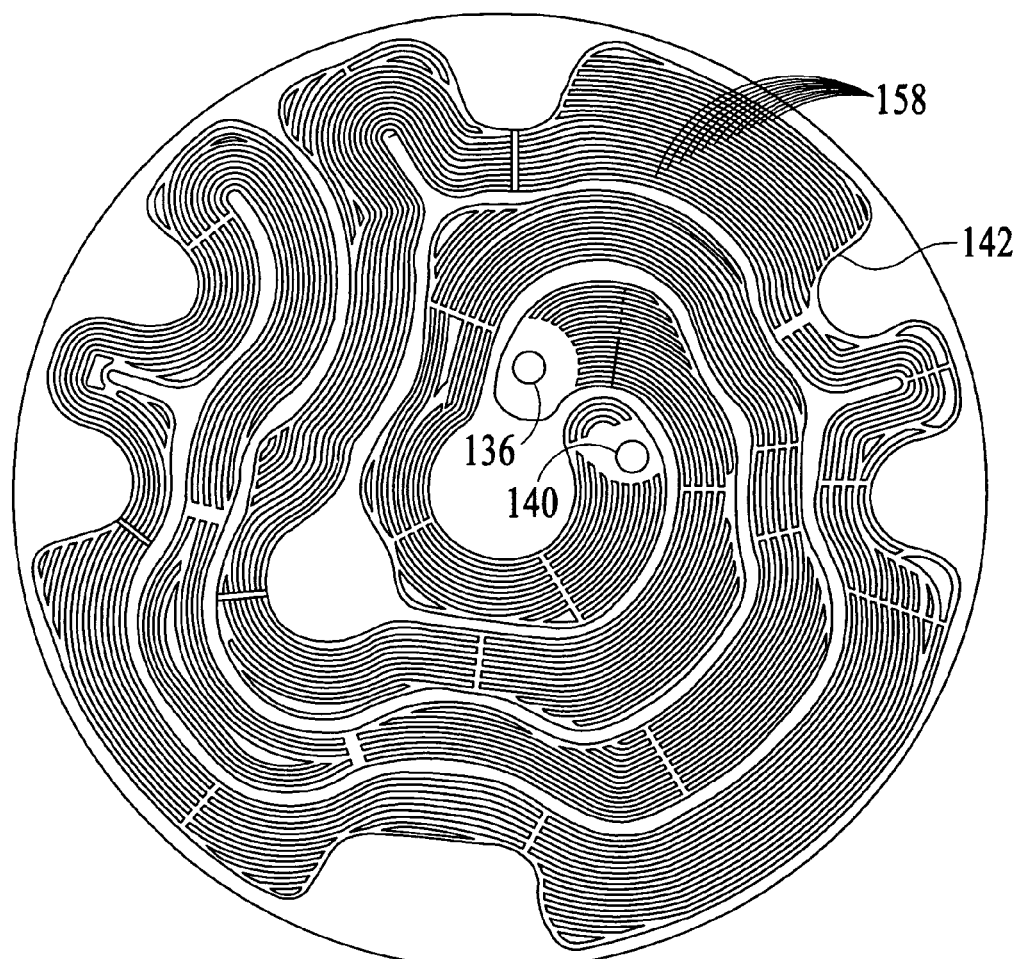
FIG. 4a is a schematic top view of an embodiment of a substrate support having serpentine fluid channels.
Figure 4B:
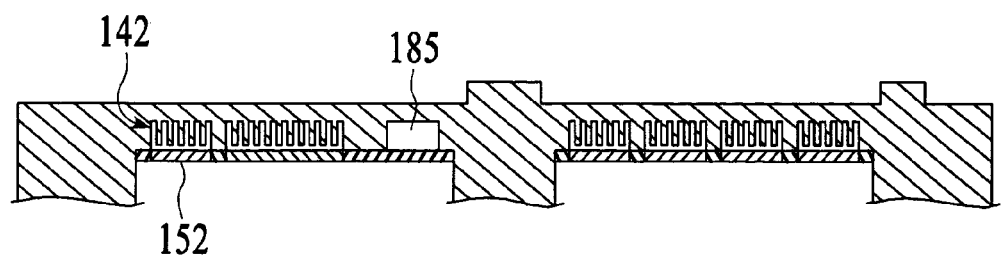

Another exemplary embodiment of an elongated fluid channel 142 is illustrated in FIG. 4a in a schematic top view that shows the multiple integral fins 158 in the channel 142, and in FIG. 4b from a cross-sectional sideways perspective. This embodiment of the channel 142 comprises more integral fins 158 than the embodiments shown in FIGS. 3a–e, and the number of integral fins 158 changes along the length of the channel 142. As the channel 142 becomes wider, the number of Integral fins 158 generally increases, and as the channel 142 narrows, the number of integral fins 168 generally decreases. As the heat transfer fluid 138 passes through the channel 142, the heat transfer fluid 138 is variably perturbed as it is forced to laterally spread and contract, and fit between the changing numbers of integral fins 158. For example. FIG. 4b shows six cross-sections of the channel 142. From left to right, the cross-sections comprise integral fins 158 numbering 6, 11, 6, 6, 6, and 6, respectively, corresponding to different sections of the channel 142 having different widths.

Figure 5:
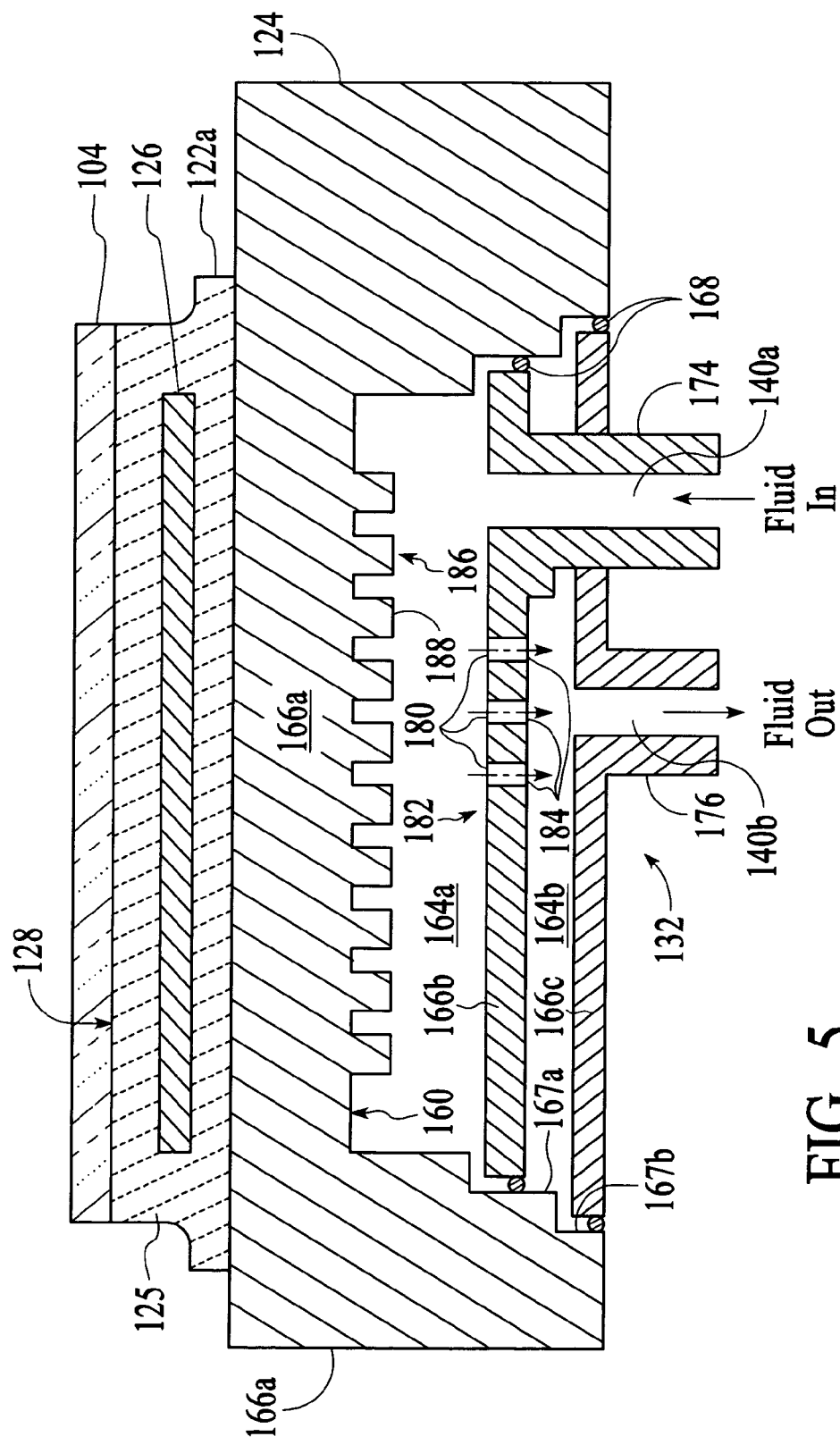
FIG. 5 is a cross-sectional side view of an embodiment of a substrate support comprising an electrostatic chuck and a fluid reservoir below the chuck.
Figure 6:
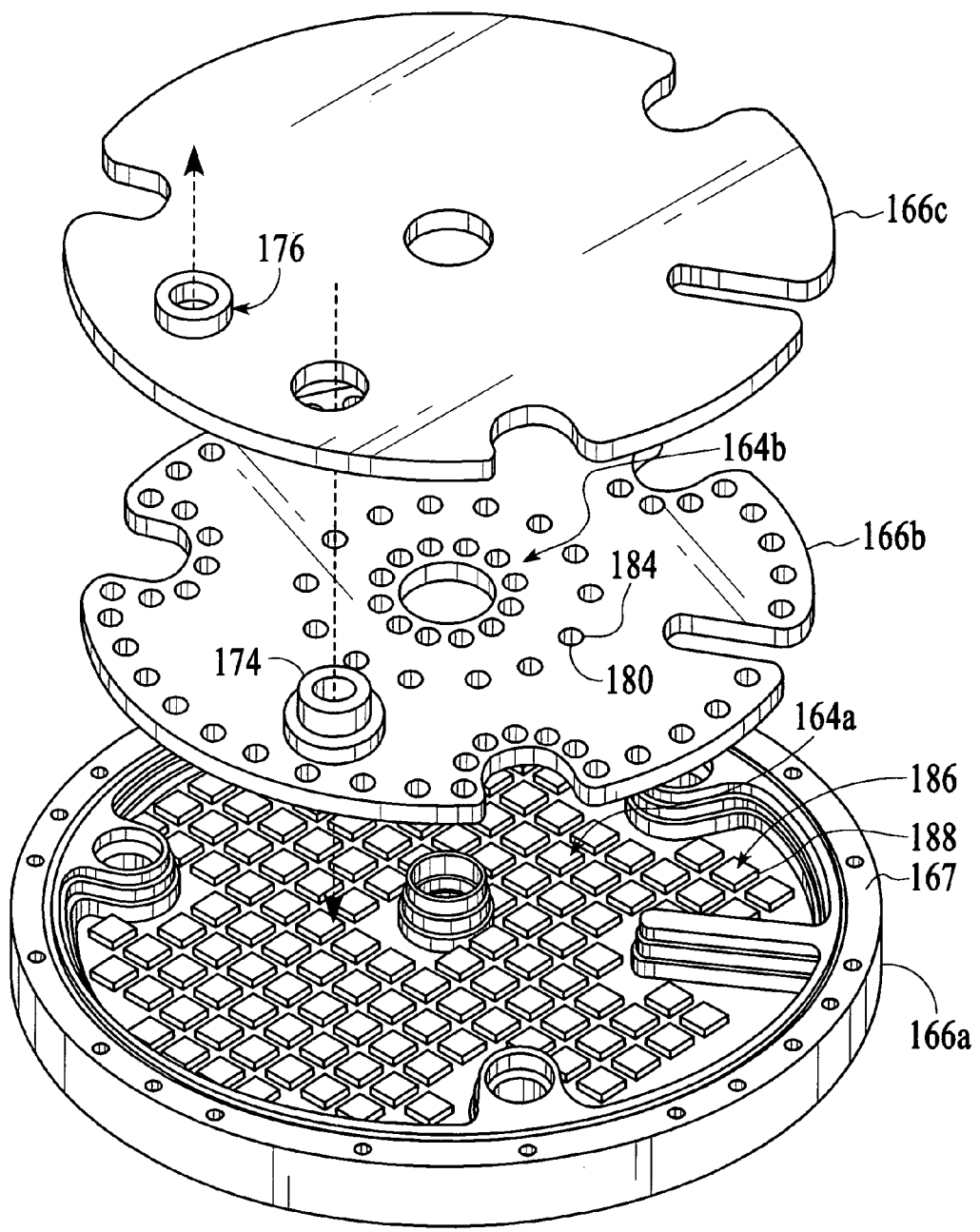
FIG. 6 is a perspective view of an assembly of shaped walls used to form the substrate support of FIG. 5.
Figure 7:
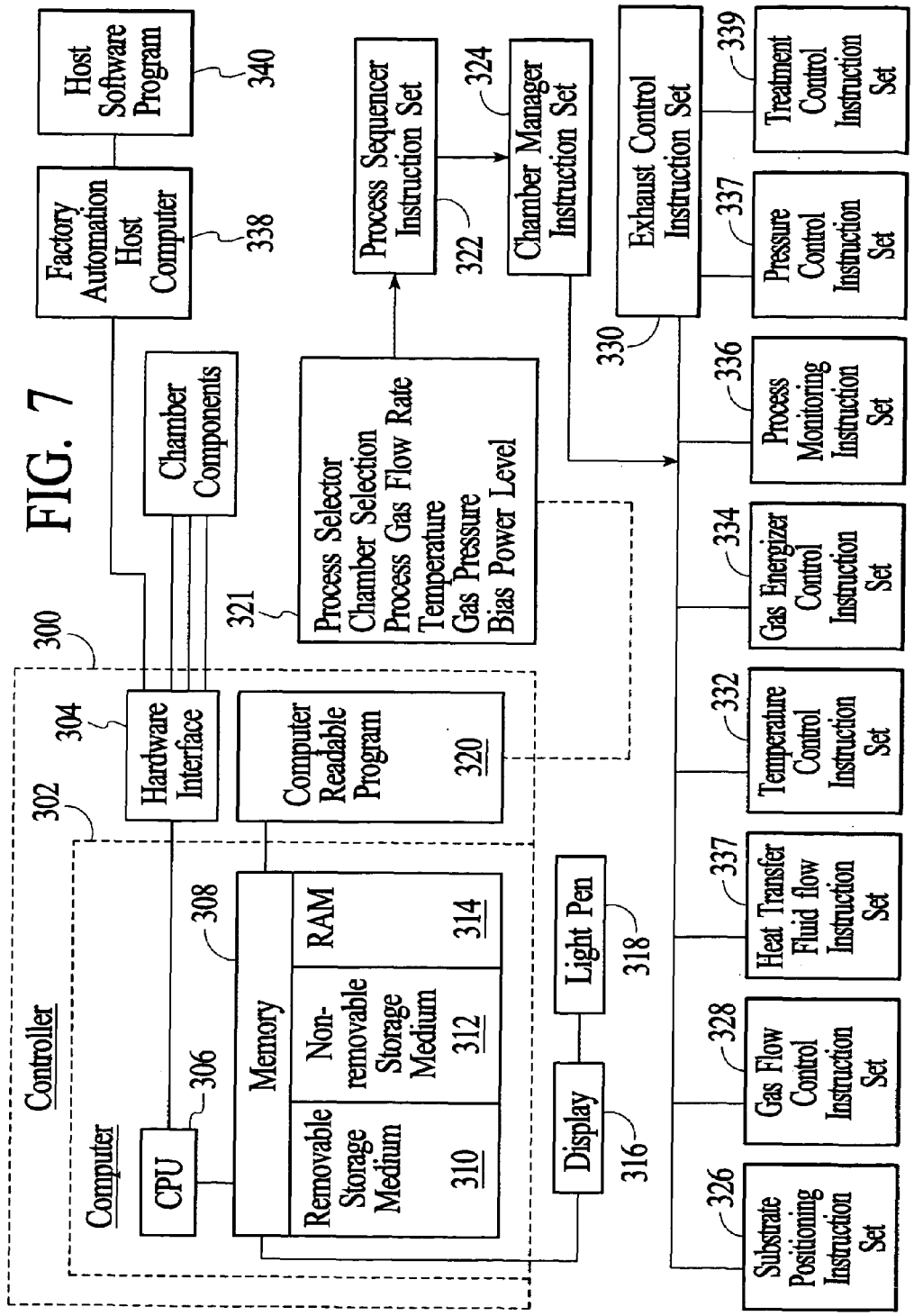
FIG. 7 is a flow chart of the controller which may be used to operate the substrate processing apparatus and process chamber.

In an alternative version of the fluid circulating reservoir 134, an exemplary embodiment of which is illustrated in FIG. 5, the reservoir 134 comprises an upper wall 616a and a lower wall 166b with an enclosed volume therebetween. A peripheral sidewall 167 joins the upper wall 166a to the lower wall 166b. The peripheral sidewall 167 of the reservoir 134 is about a perimeter of the substrate 104. The reservoir 134 of the heat transfer system 132 may be a closed basin 164 having a shallow, round shape that is adapted to contain a volume of the heat transfer fluid 138. The substrate receiving surface 128 covers an area, and the reservoir 134 extends across at least about 60% of the area of the substrate receiving surface 128. A plurality of walls 156 can additionally be bonded to one another to form and enclose a plurality of reservoirs 134 therebetween. For example, the walls 166a,b,c can enclose a plurality of reservoirs 134 that are basins 164a,b, as shown in FIG. 6. Typically, each of the walls 166 comprises a thickness of from about 0.1 to about 1 cm (from about 0.04 to about 0.40 inches), and more preferably from about 0.1 to about 0.25 cm (from about 0.04 to about 0.10 inches).

Returning to FIG. 5, the walls 166 are bonded to one another at a plurality of bonding regions 168 between the walls 186 such that the bottom of one wall 166 covers the basin 164a,b formed by the wall 166b underlying it. In one embodiment, an upper wall 166a is sealed to a lower wall 166b at a peripheral sidewall 167a about the radial periphery to form the first basin 164a. A second reservoir 134 that is a basin 164b is formed by sealing a third wall 166c at the peripheral sidewall 167b below the lower wall 166b. The bonding regions 168 typically have a thickness of from about 0.0002 to about .0127 cm (equivalent to from about .0001 to about .0050 inches). The walls 166 are aligned to one another so that the basins 164, first and second fluid inlets 174, 184, and first and second fluid outlets 180, 176 form the heat transfer system 132 that is used to regulate the temperature of the substrate support 120.

The first fluid inlet 174 comprises an inlet port near a peripheral portion of the reservoir 134; and the first fluid outlet 176 comprises an outlet port near a central portion of the reservoir 134. The heat transfer fluid 138 is supplied to the first basin 164a through the first inlet 174 to guide the heat transfer fluid 138 to the first basin 164a. The fluid 138 is then circulated through the first basin 164a and ejected through a plurality of first outlets 180. The first outlets 180 may terminate at a radially central portion 182 of the first basin 164a. After the heat transfer fluid 138 exits through the first outlets 180 (of the first basin 164a), it is received into the second basin 164b via second inlets 184. The first outlets 180 become the second inlets 184 that supply the fluid 138 to the second basin 164b. The fluid 138 passes through the second basin 164b and then is evacuated through the second cutlet 176.

The closed basins 164 allow a sufficient volume of turbulent heat transfer fluid 138 to flow therethrough to maintain the desired temperature of the supped 120. For example, the closed basins 164 may allow the passage of at least about 7.5 liters/min of the heat transfer fluid 138. The enhancement of heat transfer is achieved by flowing the heat transfer fluid 138 through an enclosed volume that is below, and extends substantially continuously across, the substantially the entire area of the substrate 104, and simultaneously generating turbulence in the flow of the heat transfer fluid 138 In the volume.

At least one of the reservoirs 134 comprises a plurality of protrusions 186 extending downwardly from the upper wall 166a into the reservoir 134, causing the heat transfer fluid 138 to flow around the protrusions 186 in the reservoir 134. The protrusions 186 obstruct the flow of the heat transfer fluid 138 to cause turbulence in the heat transfer fluid 138, thereby improving heat conduction between the heat transfer fluid 138 and the support 120.

The protrusions 186 also disrupt the formation of stagnant laminar that would otherwise reduce heat transfer between the heat transfer fluid 138 and the base 124. These stagnant laminar have temperatures that are closer to the actual temperature of the chuck 122 than the desired temperature, and thus reduce the efficiency of temperature regulation of the chuck 122. For example, laminar having reduced flow speeds may form near the inner surface 190 of the reservoir 134, resulting in stagnant boundary layers in the flow of the heat transfer fluid 130 and consequently impeding heat transfer. These stagnant laminar form when the heat transfer fluid 138 near the inner surface 190 is held back by friction against the inner surface 190.

In one version, the protrusions 186 comprise mesas 188, as shown in FIGS. 5 and 6: The mesas 188 may be shaped as discrete protruding segments having polyhedra or rectangular-shaped cross-sections, angled or angular segments that are positioned to acute or obtuse angles to the substrate receiving surface 35. The mesas 188 may also be of different height, width and length within the reservoir 134. Depending upon the arrangement of the mesas 188 in the reservoir 134, the height can range from about 10 to about 20 mm. The width may be from about 10 to about 20 mm. The depth can also vary.

In one embodiment the mesas 158 are formed by a porous three-dimensional structure. For example, the three-dimensional structure may have a porosity of from about 50% to about 97% open space. A porosity per linear length of from about 5 to about 40 pores per linear inch (ppi) (from about 2 to about 16 pores per linear centimeter) may also be desirable. Aluminum Duocel (trademark of ERG Corporation, Oakland, Calif.) and silicon carbide Duocel® are two examples of porous materials that may be used to form the mesas 188. Duocel® has a continuously connected, open-celled (reticulated) geometry with a duodecahedronal cell shape.

The mesas 188 are arranged to create consistent turbulence in flow patterns throughout the area below the substrate 104. An example of such an arrangement is a waffle pattern. The heights, lengths, and widths of each mesa 188 within the pattern may vary, but this dimensional variation also follows a pattern conducive to even heat distribution in the reservoir 134. In one embodiment, the mesas 188 are equally sized and periodically spaced apart in the reservoir 134.

Returning to FIG. 1, a gas recirculator 191 may provide a heat transfer gas to the receiving surface 128 of the support 120 to control the temperature of the substrate 104. In this version, the chuck 122 of the support 120 comprises (i) a gas conduit 192 for holding the heat transfer gas in the chuck 122, and (ii) gas vents 194 extending from the gas conduit 192 to the receiving surface 128 for providing the heat transfer gas to the receiving surface 128 of the support 120 below the substrate 104. During operation, the heat transfer gas flows into the gas conduit 192 in the support 120, through the gas vents 194, and exits below the receiving surface 128. The heat transfer gas is used to provide efficient heat transfer rates between the substrata 104 and the chuck 122. The temperature of the chuck 122 in turn being controlled by the fluid recirculator 141. The substrate 104 covers and seals the peripheral edge of the chuck 122 to reduce leakage of the heat transfer gas from below the substrate 104 to maintain the substrate 104 at a constant temperature. Typically, the heat transfer gas is an inert gas, such as helium or argon, supplied at a pressure of from about 5 to about 30 Torr.

In operation, process gas is introduced into the chamber 106 through a process gas supply 130 that includes a process gas source 117 and a gas distributor 137. The gas distributor 137 may comprise one or more conduits 130 having one or more gas flow valves 133 and one or more gas outlets 145 around a periphery of the substrate 104 which may be held in the process zone 108 on a support 120 having a substrate receiving surface 128. Alternatively, the gas distributor 137 may comprise a showerhead gas distributor (not shown). Spent process gas and etchant byproducts are exhausted from the chamber 106 through an exhaust 151, which may include an exhaust conduit 177 that receives spent process gas from the process zone 108, a throttle valve 135 to Control the pressure of process gas in the chamber 106, the treatment reactor 150, and one or more exhaust pumps 156.

The process gas may be energized to process the substrate 104 by a gas energizer 154 that couples energy to the process gas in the process zone 108 of the chamber 106. In the version shown in FIG. 1, the gas energizer 154 comprises process electrodes 139, 149 that may be powered by a power supply 159 to energize the process gas. The process electrodes 139, 149 may include an electrode 149 that is, or is in, a wall, such as a sidewall 114 or ceiling 118 of the chamber 106 that may be capacitively coupled to another electrode 139, such as an electrode in the support 120 below the substrate 104. Alternatively or additionally, as shown in FIG. 1, the gas energizer 157 may comprise an antenna 175 comprising one or more inductor coils, which may have a cylindrical symmetry about the center of the chamber 106. In yet another version, the gas energizer 154 comprises a microwave source and waveguide to activate the process gas by microwave energy in a remote zone (not shown) upstream from the chamber 106.

To process a substrate 104, the process chamber 106 is evacuated and maintained at a predetermined sub-atmospheric pressure. The substrate 104 is then provided on the support 120 by a substrate transport 101, such as for example a robot arm and a lift pin system. The gas supply 130 provides a process gas to the chamber 106 and the gas energizer 154 couples RF energy to the process gas to energize the gas to process the substrate 104. For example, very high frequency (VHF) electromagnetic waves having frequencies of from about 30 to about 300 MHz may be coupled into the process gas. A process chamber 106 using VHF energy may especially benefit from the heat transfer system 132 because smaller tolerances of processing temperature and temperature uniformity are desirable for the VHF gas energizing. Alternatively, microwaves may be coupled into the process gas. Similarly, to clean the chamber after processing of the substrate 104, the gas supply 130 provides a process gas comprising a cleaning gas to the chamber 106 and the gas energizer 154 energizes the cleaning gas to clean the chamber 106. Effluent generated during the chamber 106 process is exhausted from the chamber 106 and received by the treatment reactor 150, where the effluent may be abated to reduce the hazardous gas content of the effluent.

A controller 300 may be used to operate the substrate processing apparatus 102 and process chamber 106. A suitable controller comprises a computer 302 having a central processing unit (CPU) 306, such as a Pentium Processor commercially available from Intel Corporation, Santa Clara, Calif., that is coupled to a memory 308 and peripheral computer components. The controller 300 may further comprise a plurality of interface cards (also not shown) including, for example, analog and digital input and output boards, interface boards, and motor controller boards. The interface between an operator and the controller 300 can be, for example, via a display 316 and a light pen 318.

The CPU 306 further comprises a memory 308, a removable storage medium 310, a non-removable storage medium 312, random access memory (RAM) 314, a display 316 and a light pen 318. The CPU 306 is linked with a hardware interface 304, which is set to operate the chamber components via a factory automation host computer 338 with a host software program 340.

The controller 300 further comprises a computer readable program 320 to operate components 321 of the chamber 106, such as process selector, chamber selection, process gas flow rate, temperature, gas pressure and bias power level. For example, the computer readable program 320 comprises a process sequencer instruction set 322, a chamber manager instruction set 324, a substrate positioning instruction set 326, a gas flow control instruction set 328, a heat transfer fluid flow instruction set 337, a temperature control instruction set 332, a gas energizer control instruction set 334, a process monitoring instruction set 336, an exhaust control instruction set 330, a pressure control instruction set 337 and a treatment control instruction set 339.

The computer readable program 320 comprises program code, which can be written in any conventional computer-readable programming language, such as for example, assembly language or C++. Suitable program code is entered into a single file, or multiple files, using a conventional text editor, and stored or embodied in the computer memory 308. If the entered code text is in a high level language, the code is compiled, and the resultant compiler code is then linked with an object code of precompiled library routines. To execute the linked compiled object code, the operator invokes the program code, causing the controller 300 to load the object code into the computer memory 308. The CPU 306 reads and executes the program code to perform the tasks identified therein.

While the present invention has been described In considerable detail with reference to certain preferred versions, many other versions should be apparent to those of ordinary skill in the art. For example, the substrate support described herein can be used in a plasma vapor deposition (PVD) chamber or other deposition chambers. Therefore, the spirit and scope of the appended claims should not be limited to the description of the preferred versions contained herein.

What is claimed is:

1. A substrate support for a substrate processing chamber, the substrate support comprising:
   (a) a chuck having a substrate receiving surface;
   (b) a fluid circulating reservoir and a second reservoir below the chuck, the fluid circulating reservoir comprising upper and lower walls that are joined by a peripheral sidewall extending outwardly from the upper wall, and the second reservoir comprising a third wall that is joined by the peripheral sidewall to the lower wall;
   (c) a fluid inlet to supply a heat transfer fluid to the fluid circulating reservoir;
   (d) a plurality of protrusions comprising spaced apart mesas that extend into the fluid circulating reservoir a sufficient length to cause the heat transfer fluid to flow around the protrusions, thereby perturbing the flow of heat transfer in the fluid circulating reservoir; and
   (e) a fluid outlet to discharge the heat transfer fluid from the fluid circulating reservoir into the second reservoir.

2. A substrate support according to claim 1 wherein the chuck comprises an electrostatic chuck having an electrode covered by a dielectric, and an electrical contact to charge the electrode.

3. A substrate support according to claim 1 wherein the peripheral sidewall of the reservoir is about a perimeter of the substrate.

4. A substrate support according to claim 1 wherein the substrate receiving surface covers an area, and the fluid circulating reservoir extends across at least about 60% of the area of the substrate receiving surface.

5. A support according to claim 1 wherein the spaced apart mesas extend downwardly from the upper wall.

6. A support according to claim 1 wherein the protrusions are of a three-dimensional metal foil.

7. A support according to claim 1 wherein the fluid inlet comprises an inlet port near a peripheral portion of the fluid circulating reservoir; and the fluid outlet comprises an outlet port near a central portion of the fluid circulating reservoir.

8. A substrate processing chamber comprising a substrate support according to claim 1, the chamber further comprising:
   a gas supply conduit to provide a gas into the chamber;
   a gas energizer to energize the gas to form a plasma; and
   an exhaust port to exhaust the gas from the chamber.

9. A support for a substrate processing chamber, the support comprising:
   (a) an upper wall having a channel comprising serpentine convolutions, and comprising integral fins that are spaced apart and extend outwardly from the upper wall and into the channel, the fins having tips;
   (b) a lower wall to cover the channel such that the tips of the fins define gaps with the lower wall;
   (c) a fluid inlet to pass a heat transfer fluid into the channel; and
   (d) a fluid outlet to discharge the heat transfer fluid.

10. A support according to claim 9 wherein the channel comprises a roughened internal surface having a root mean square roughness value of at least about 125 microns.

11. A support according to claim 9 wherein the upper wall comprises a recessed trench having the channel therein, and wherein the lower wall is sized to seat in the recessed trench to close the channel.

12. A support according to claim 9 wherein the channel comprises a roughened internal surface having a root mean square roughness value of at least about 125 microns.

13. A support according to claim 9 wherein the channel comprises a first cross-section along a first length of the channel and a second cross-section along a second length of the channel.

14. A substrate processing chamber comprising a substrate support according to claim 9, the chamber further comprising:
   a gas supply conduit to provide a gas into the chamber;
   a gas energizer to energize the gas to form a plasma; and
   an exhaust port to exhaust the gas in the chamber.

15. A support for a substrate processing chamber, the support comprising:
   (a) a chuck having a substrate receiving surface;
   (b) a fluid circulating reservoir below the chuck, the reservoir comprising upper and lower walls that are joined together to form a channel therebetween, the channel comprising serpentine convolutions and having a roughened internal surface with a root mean square roughness value of at least about 125 microns;
   (c) a fluid inlet to pass a heat transfer fluid into the channel; and
   (d) a fluid outlet to discharge the heat transfer fluid.

16. A support according to claim 15 wherein the channel comprises one or more spaced apart integral fins that extend into the channel.

17. A support according to claim 15 wherein the channel comprises a first cross-section along a first length of the channel and a second cross-section along a second length of the channel.

18. A support for a substrate processing chamber, the support comprising:
   (a) a chuck having a substrate receiving surface;
   (b) a fluid circulating reservoir below the chuck, the reservoir comprising upper and lower walls that are joined together to form a channel therebetween, the channel having a first cross-section along a first length of the channel and a second cross-section along a second length of the channel, and the channel comprises serpentine convolutions;
   (c) a fluid inlet to pass a heat transfer fluid into the channel; and
   (d) a fluid outlet to discharge the heat transfer fluid.

19. A support according to claim 18 wherein the channel comprises one or more spaced apart integral fins that extend into the channel.

20. A support for a substrate processing chamber, the support comprising:
   (a) a chuck having a substrate receiving surface;
   (b) a fluid circulating reservoir below the chuck, the reservoir comprising upper and lower walls that are joined together to form a channel therebetween,
      (i) the upper wall comprising integral fins that are spaced apart and extend outwardly from the upper wall and into the channel, the integral fins have tips that define gaps with lower wall;
      (ii) the channel having a first cross-section along a first length of the channel and the second cross-section along a second length of the channel, and
      (iii) the channel turning back upon itself and comprising serpentine convolutions along its length;
   (c) a fluid inlet to pass a heat transfer fluid into the channel; and
   (d) a fluid outlet to discharge the heat transfer fluid.

21. A substrate support for a substrate processing chamber, the substrate support comprising:
   (a) a chuck having a substrates receiving surface;
   (b) first and second fluid circulating reservoirs below the chuck, the first reservoir comprising upper and lower walls that are joined by a peripheral sidewall, and a third wall that is joined along a peripheral lip to the lower wall to define the second reservoir;
   (c) a fluid inlet to supply a heat transfer fluid to the first reservoir,
   (d) a plurality of protrusions that extend into the first reservoir to perturb the flow of the heat transfer fluid in the first reservoir, and
   (e) a fluid outlet to discharge the heat transfer fluid from the first reservoir to the second reservoir.

22. A support for a substrate processing chamber, the support comprising:
   (a) an upper wall comprising a recessed trench having a channel therein;
   (b) a lower wall to sized to seat in the recessed trench to close the channel;
   (c) integral fins that are spaced apart and extend outwardly from the upper wall and into the channel;
   (d) a fluid inlet to pass a heat transfer fluid into the channel; and
   (e) a fluid outlet to discharge the heat transfer fluid.

23. A support for a substrate processing chamber, the support comprising:
   (a) an upper wall comprising a recessed trench having a channel therein and comprising integral fins that are spaced apart and extend outwardly from the upper wall and into the channel, the fins having tips;
   (b) a lower wall sized to seat in the recessed trench to close and cover the channel such that the tips of the fins define gaps with the lower wall;
   (c) a fluid inlet to pass a heat transfer fluid into the channel; and
   (d) a fluid outlet to discharge the heat transfer fluid.

* * * * *